United States Patent
Abhishek et al.

(10) Patent No.: US 12,244,331 B2
(45) Date of Patent: Mar. 4, 2025

(54) DIFFERENTIAL INPUT RECEIVER CIRCUIT TESTING WITH A LOOPBACK CIRCUIT

(71) Applicant: NXP USA, Inc., Austin, TX (US)

(72) Inventors: Kumar Abhishek, Bee Cave, TX (US); Srikanth Jagannathan, Austin, TX (US); Frederic Benoist, Saint Paul de Vence (FR)

(73) Assignee: NXP USA, Inc., Austin, TX (US)

( * ) Notice: Subject to any disclaimer, the term of this patent is extended or adjusted under 35 U.S.C. 154(b) by 406 days.

(21) Appl. No.: 17/813,774

(22) Filed: Jul. 20, 2022

(65) Prior Publication Data
US 2023/0033973 A1  Feb. 2, 2023

(30) Foreign Application Priority Data
Jul. 28, 2021 (EP) .................................. 21306051

(51) Int. Cl.
| H04B 1/10 | (2006.01) |
| G01R 31/28 | (2006.01) |
| G01R 31/317 | (2006.01) |
| H03F 3/45 | (2006.01) |

(Continued)

(52) U.S. Cl.
CPC ........... *H04B 1/10* (2013.01); *H03F 3/45493* (2013.01); *H04B 1/1607* (2013.01); *H04L 25/0272* (2013.01)

(58) Field of Classification Search
None
See application file for complete search history.

(56) References Cited

U.S. PATENT DOCUMENTS

| 7,756,197 B1 | 7/2010 | Ferguson et al. |
| 7,855,576 B1 * | 12/2010 | Luo ................ H03K 19/017509 326/82 |
| 8,037,377 B1 | 10/2011 | Chia et al. |

(Continued)

FOREIGN PATENT DOCUMENTS

WO   WO-2022078581 A1 *  4/2022   ........... H03D 7/1466

OTHER PUBLICATIONS

Kim et al., "An 11.2-Gb/s LVDS Receiver With a Wide Input Range Comparator", IEEE Transactions on Very Large Scale Integration (VLSI) Systems, Oct. 1, 2014, pp. 2156-2163, vol. 22, No. 10, IEEE, Piscataway, NJ, USA.

(Continued)

*Primary Examiner* — Mohammed Rachedine

(57) ABSTRACT

A low voltage differential signaling (LVDS) receiver includes a receiver circuit including first and second inputs coupled to first and second conductive pads, respectively, and an output coupled to an input of a digital controller, and a dummy transmitter circuit including a first input coupled to receive a common mode voltage (VCM) tune signal, a second input coupled to a loopback input signal, a third input coupled to a loopback enable signal, a first output coupled to the first input of the receiver circuit, and a second output coupled to the second input of the receiver circuit. When a test mode of operation is enabled, the digital controller asserts the loopback enable signal, and the dummy transmitter circuit generates a pair of test differential signals based on the VCM tune signal, wherein the VCM tune signal varies to test the LVDS receiver over a range of common mode voltages.

20 Claims, 7 Drawing Sheets

(51) Int. Cl.
*H04B 1/16* (2006.01)
*H04L 25/02* (2006.01)

(56) References Cited

U.S. PATENT DOCUMENTS

| | | |
|---|---|---|
| 8,638,838 B1 | 1/2014 | Betts et al. |
| 8,923,372 B2 | 12/2014 | Yang et al. |
| 9,088,521 B2 | 7/2015 | Olgaard |
| 9,231,731 B1 * | 1/2016 | Nguyen ................ H04L 1/0036 |
| 9,509,310 B1 * | 11/2016 | Goumballa .............. H04B 1/04 |
| 9,651,614 B1 | 5/2017 | Mobin et al. |
| 9,733,309 B2 | 8/2017 | Li |
| 10,148,261 B1 | 12/2018 | Jagannathan et al. |
| 2006/0034358 A1 | 2/2006 | Okamura |
| 2009/0153219 A1 | 6/2009 | Wu et al. |
| 2010/0261431 A1 | 10/2010 | Olgaard |
| 2013/0021082 A1 * | 1/2013 | Aude ................. H03F 3/45668 327/309 |

OTHER PUBLICATIONS

Yeong et al., "1.2Gbps LVDS interface", International Symposium on Integrated Circuits, Sep. 1, 2007, pp. 382-385, IEEE, Piscataway, NJ, USA.

Traversi et al., "Characterization of an LVDS Link in 28 nm CMOS for Multi-Purpose Pattern Recognition", IEEE International Symposium on Circuits and Systems (ISCAS), May 27, 2018, pp. 1-4, IEEE, Piscataway, NJ, USA.

* cited by examiner

DIFFERENTIAL INPUT RECEIVER CIRCUIT TESTING WITH A LOOPBACK CIRCUIT

BACKGROUND

Field

This disclosure relates generally to integrated circuits, and more specifically, to differential input receiver circuit testing with a loopback circuit.

Related Art

Low Voltage Differential Signal (LVDS) is a technical standard that specifies electrical characteristics of a differential, serial communications protocol. LVDS typically operates at low power and can run at very high speeds, such as 5 Gbps. In an LVDS transmission system, differential signals are provided via a pair of transmission lines to a load in which the pair of lines carry complementary signals.

LVDS receivers are typically designed for a wide common mode voltage range in order to account for ground shift for signals coming from another printed circuit board (PCB). However, while testing an LVDS receiver at probe during manufacture, the LVDS receiver may only be tested at a single common mode voltage. Therefore, complete coverage may not be achieved during probe for the entire allowable common mode range, allowing defectivities to escape. A need exists for a receiver circuit with improved testing capabilities, especially for receiver circuits having wide common range capabilities.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integrated circuit (IC) includes a receiver circuit which is designed to operate with a wide common mode voltage range. The receiver circuit includes a receiver (e.g. Low Voltage Differential Signal (LVDS) receiver) and a loopback circuit which allows for loopback testing of the receiver. Loopback testing allows a dummy transmitter (e.g. an LVDS transmitter) to generate test differential signals about a common mode voltage. The test differential signals are provided as test inputs to the receiver. In one embodiment, the dummy transmitter receives a tunable common mode voltage from a digital-to-analog converter (DAC) and generates the differential signals based on the received tunable common mode voltage. This allows for testing of the entire common mode range at probe, which may aid in catching more defects. The loopback testing with the tunable common mode voltage may also be performed during operation, if needed. Furthermore, the loopback testing with tunable common mode voltage may be used to concurrently test multiple receivers, in which portions of the loopback circuits, such as the DAC or dummy transmitter, may be shared among the multiple receivers.

Figure 1:
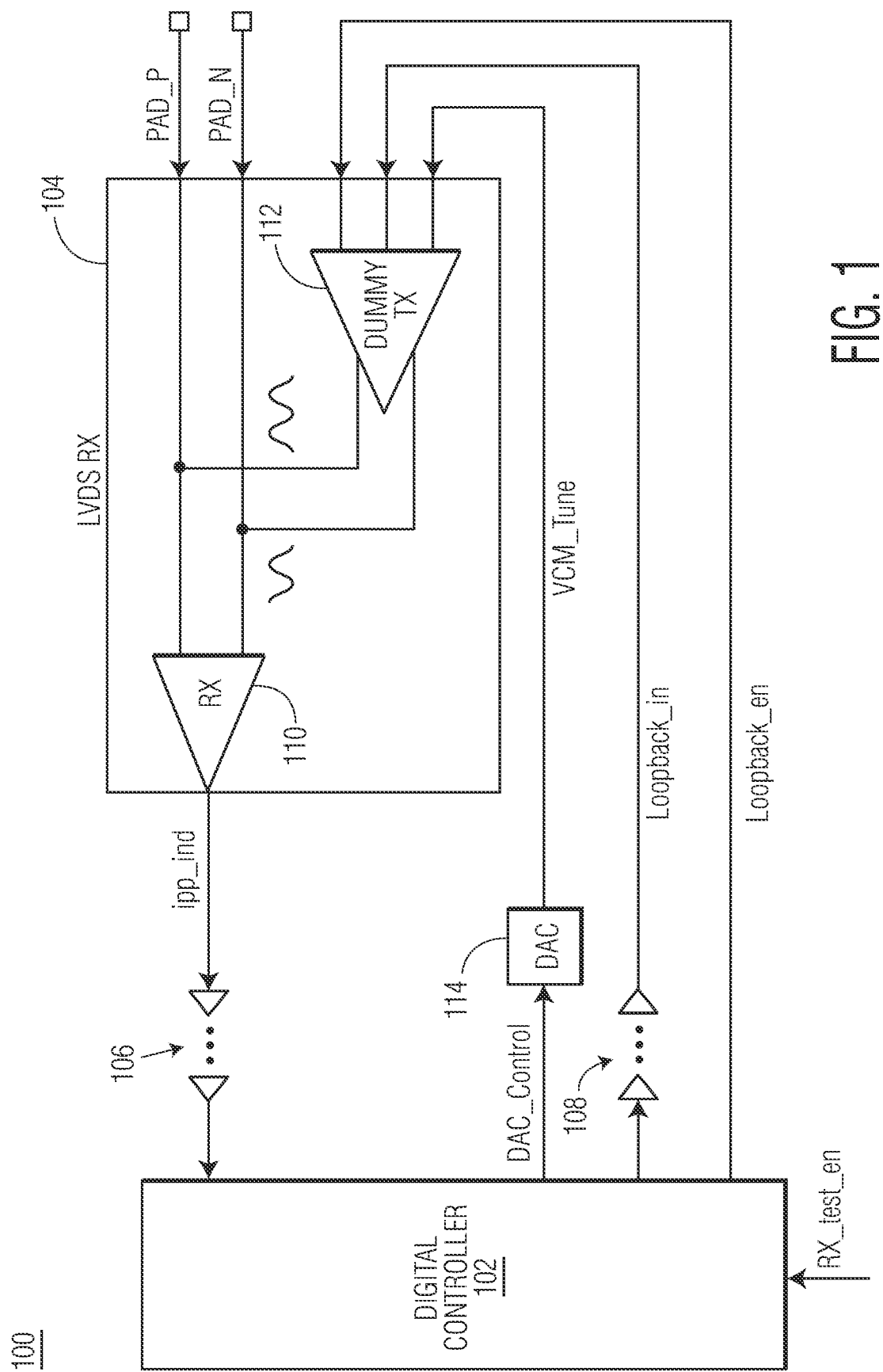
FIG. 1 illustrates, in partial block diagram and partial schematic form, a differential input receiver circuit with a loopback circuit in accordance with one embodiment of the present invention.

FIG. 1 illustrates a receiver circuit 100 which may be implemented on an integrated circuit (IC), such as in a System-on-Chip (SoC). In on embodiment, receiver circuit 100 includes a digital controller 102, an LVDS receiver 104, a DAC 114, buffers 106 and buffers 108. LVDS receiver 104 includes a receiver (RX) 110 and a dummy transmitter (TX) 112. LVDS receiver 104 receives differential pad signals Pad_P and Pad_N from external pads, which are received by RX 110. RX 110 provides a digital data stream output, ipp_ind, to buffers 106, which communicate ipp_ind to digital controller 102. Digital controller 102 provides control signals (DAC_Control) to DAC 114, which provides an analog voltage corresponding to a tunable common mode voltage (VCM_Tune) to a first input of dummy TX 112. Digital controller 102 also provides a digital data stream via buffers 108 as Loopback_in to a second input of TX 112. Digital controller 102 also provides a loopback enable signal, Loopback_en, to a third input of TX 112. When testing is enabled, loopback_en is asserted (e.g. to a logic level one), and dummy TX 112 generates a pair of test differential signals about a common mode voltage, provided by VCM_Tune. This pair of test differential signals is provided as the differential input to RX 110 rather than the differential signal from Pad_P and Pad_N from the external pads. (In one embodiment, the pair of test differential signals includes a first signal having a first polarity and a second test signal having a second polarity.)

Note that DAC 114, dummy TX 112, and RX 110 form a test loopback circuit in which inputs are provided to the test loopback circuit from digital controller 102 and results are received from the test loopback circuit by digital controller 102, as will be discussed in more detail below. (Note that a test loopback circuit may simply be referred to as a loopback circuit.) Note also that digital controller 102, DAC 114, dummy TX 112, and the DAC_Control, Loopback_in, and Loopback_en signals may all be referred to collectively as built-in self-test (BIST) circuitry, and digital controller 102 may be referred to as a BIST controller.

Figure 2:
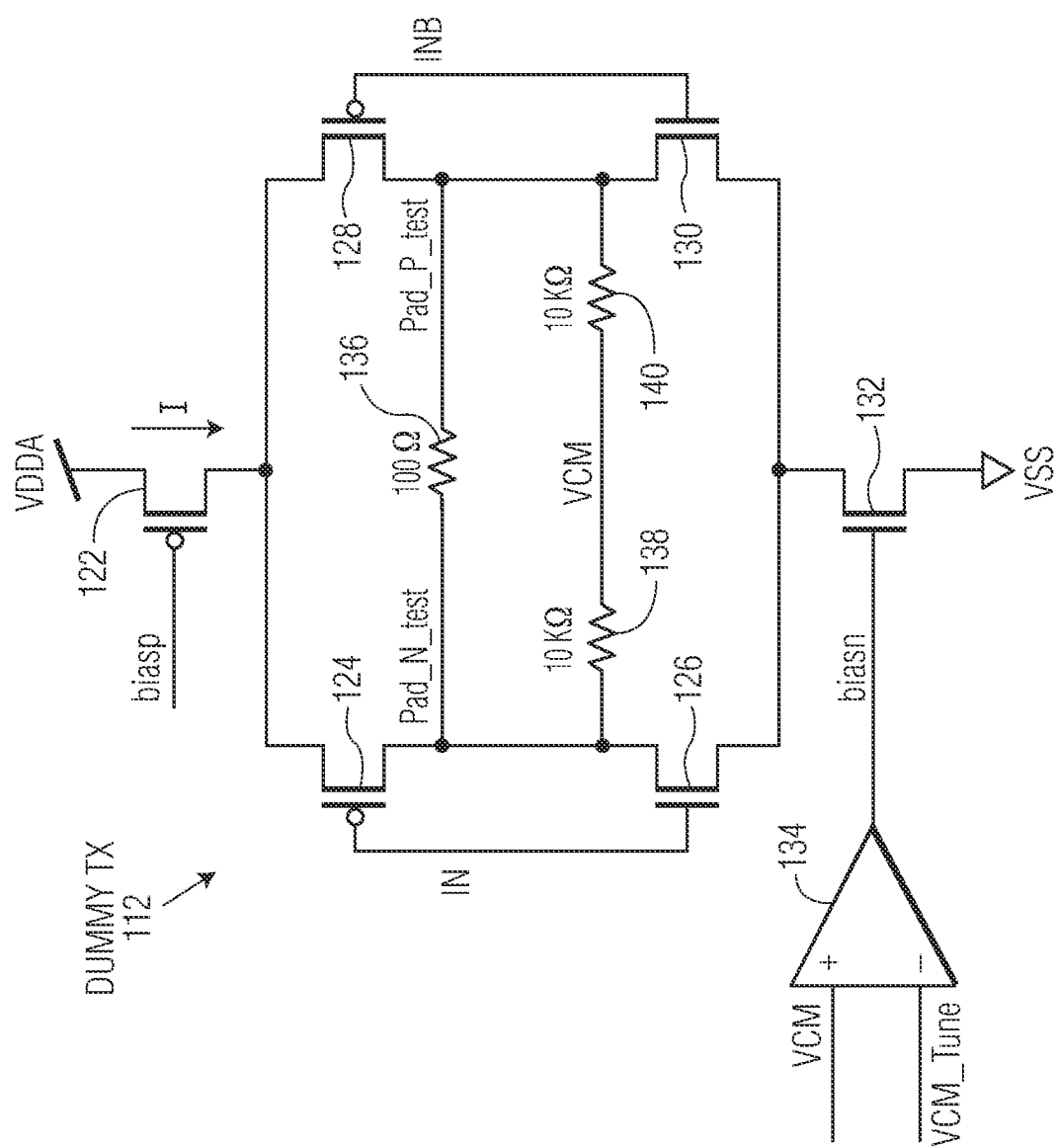
FIG. 2 illustrates, in partial block diagram and partial schematic form, a differential transmitter of the loopback circuit of the receiver circuit of FIG. 1, in accordance with one embodiment of the present invention

FIG. 2 illustrates, in partial block diagram and partial schematic form, a differential output driver circuit of dummy TX 112. In one embodiment, the differential output driver circuit of FIG. 2 corresponds to the output driver stage of dummy TX 112 (which may be an LVDS transmitter). Dummy TX 112 receives a single ended input signal (e.g. Loopback_in), and through one or more stages, converts the single ended input signal to complementary output signals, including complementary signals IN and INB, about a common mode voltage, VCM. The differential output driver circuit of dummy TX 112 receives VCM_Tune, IN, and INB and outputs complementary pad signals Pad_N_test and Pad_P_test. The pad signals are provided to RX 110 as the differential input signal during testing, when Loopback_en is asserted. Therefore, during testing, rather than receiving a differential input signal from pad signals Pad_N and Pad_P received from the external pads, RX 110 instead receives a differential input signal from Pad_P_test and Pad_N_test generated by the differential output driver circuit of dummy TX 112. That is, during normal operation, the differential input is received by RX 110 from external pads or terminals while during BIST, it is received from the loopback test circuit.

Note that, during normal operation, the differential input signal received from the external pads or terminals may be received via a pair of transmission lines in which the pair of transmission lines carry the complementary signals. In one example, the pair of transmission lines may be twisted wires or traces on a printed circuit board.

The output driver circuit of dummy TX 112, as illustrated in FIG. 2, includes PMOS transistors 124, 128, and 122, NMOS transistors 126, 130, and 132, resistors 136, 138, and 140, and an error correction amplifier 134. A bias voltage, biasp, is provided to a control electrode of transistor 122. Transistor 122 has a first current electrode coupled to a first supply voltage terminal which receives a first supply voltage, VDDA, and a second current electrode coupled to first current electrodes of transistors 124 and 128. A second current electrode of transistor 124 is coupled to a first terminal of resistor 136, a first terminal of resistor 138, and a first current electrode of transistor 126. A second current electrode of transistor 126 is coupled to a first current electrode of transistor 132. A second terminal of resistor 138 is coupled to a first terminal of resistor 140. A second current electrode of transistor 128 is coupled to a second terminal of resistor 136, a second terminal of resistor 140, and a first current electrode of transistor 130. A second current electrode of transistor 130 is coupled to the second current electrode of transistor 126 and the first current electrode of transistor 132. The circuit node between the second terminal of resistor 138 and the first terminal of resistor 140 provides the common mode voltage, VCM, of the output differential signals Pad_N_test and Pad_P_test. In one embodiment, resistors 138 and 140 each have a resistance of 10K Ohms and resistor 136 has a resistance of 100 Ohms. In one embodiment, resister 136 may be located outside the chip (e.g. outside the IC containing receiver circuit 100). Control electrodes of transistors 124 and 126 are coupled to each other and receive IN, and control electrodes of transistors 128 and 130 are coupled to each other and receive INB, which is the complementary signal to IN.

Still referring to FIG. 2, an inverting input of amplifier 134 receives a tuned common mode voltage, VCM_Tune, which, in one embodiment, is provided by DAC 114. A non-inverting input of amplifier 134 receives VCM (from the circuit node between resistors 138 and 140). An output of amplifier 134 is coupled to provide a bias voltage, biasn, to a control electrode of transistor 132. A second current electrode of transistor 132 is coupled to a second supply voltage terminal which receives a second supply voltage, VSS, in which VDDA is greater than VSS. In one embodiment, VSS is ground or 0V.

In operation, complementary signals are provided as IN and INB to generate output differential signals Pad_P_test and Pad_N_test. For example, if IN is a logic level high (and thus INB is a logic level low), then transistors 126 and 128 are turned on and transistors 124 and 130 are turned off, resulting in current flowing from transistor 128 to transistor 126 through resistor 136. Conversely, if IN is a logic level low (and thus INB is a logic level high), then transistors 124 and 130 are turned on and transistors 126 and 128 are turned off, resulting in current flowing from transistor 124 to transistor 130 through resistor 136. Note that transistors 124, 126, 128, and 130 may each be referred to as a switch, in which these switches control current flow from Pad_P_test to Pad_N_test or from Pad_N_test to Pad_P_test (depending on the values of IN and INB). Note also that transistors 122, 124, and 128 may be referred to as pull-up devices, and transistors 132, 126, and 130 may be referred to as pull-down devices.

In the illustrated embodiment, the generated Pad_P_Test and Pad_N_test signals are differential signals, in which the swing of the differential signals is represented as the difference between the voltage at Pad_P_test and the voltage at Pad_N_test. A current drive path (for current I) is therefore provided through transistor 122, transistor 124/130 or transistor 128/126 (depending on the values of IN and INB), and transistor 132. The drive path also includes a common mode resistor circuit, including resistors 138 and 140 coupled in series between Pad_N_test and Pad_P_test and including the common voltage sense node, VCM.

The signal VCM_Tune allows the VCM of the differential output driver circuit to be tuned to a desired VCM voltage. The desired VCM voltage is provided by DAC 114, in which amplifier 134 controls biasn based on the difference between VCM and the desired VCM (received as VCM_Tune) to modulate the current, I, through the current drive path.

Referring to receiver circuit 100 of FIG. 1, in one embodiment, the differential voltage swing between Pad_P and Pad_N from the external terminals is designed to be in a range of 100 mV to 400 mV, and the common mode voltage in a range of 0.2V to 1.4V. Through testing with the loopback circuit, DAC 114 can be used to provide, based on a DAC word (received as DAC_Control from digital controller 102), common mode voltages within the designed range of 0.2V to 1.4V in order to test receiver circuit 100 over the full range of common mode voltages. For example, a digital test sequence is provided as Loopback_in, with Loopback_en asserted, to dummy TX 112. As described above in reference to FIG. 2, dummy TX 112 generates a differential output from Pad_N_test and Pad_P_test of the differential output driver circuit within dummy TX 112, using the desired common mode voltage provided as VCM_Tune to error amplifier 134 of the output driver circuit. RX 110 receives this differential output and converts it to a single ended digital stream, ipp_ind, which corresponds to the digital response sequence of the digital test sequence. Digital controller 102 can then compare the two sequences to determine if RX 110 passes or fails testing.

In one embodiment, this testing is performed at various different common mode voltages such that RX 110 can be tested more completely, thus achieve better test coverage. This testing may be used, for example, to determine how sensitive RX 110 is to common mode voltage drift. Operation of FIGS. 1 and 2 will be described in more detail in reference to the timing diagrams of FIGS. 3 and 4 and the flow diagram of FIG. 5.

Figure 3:
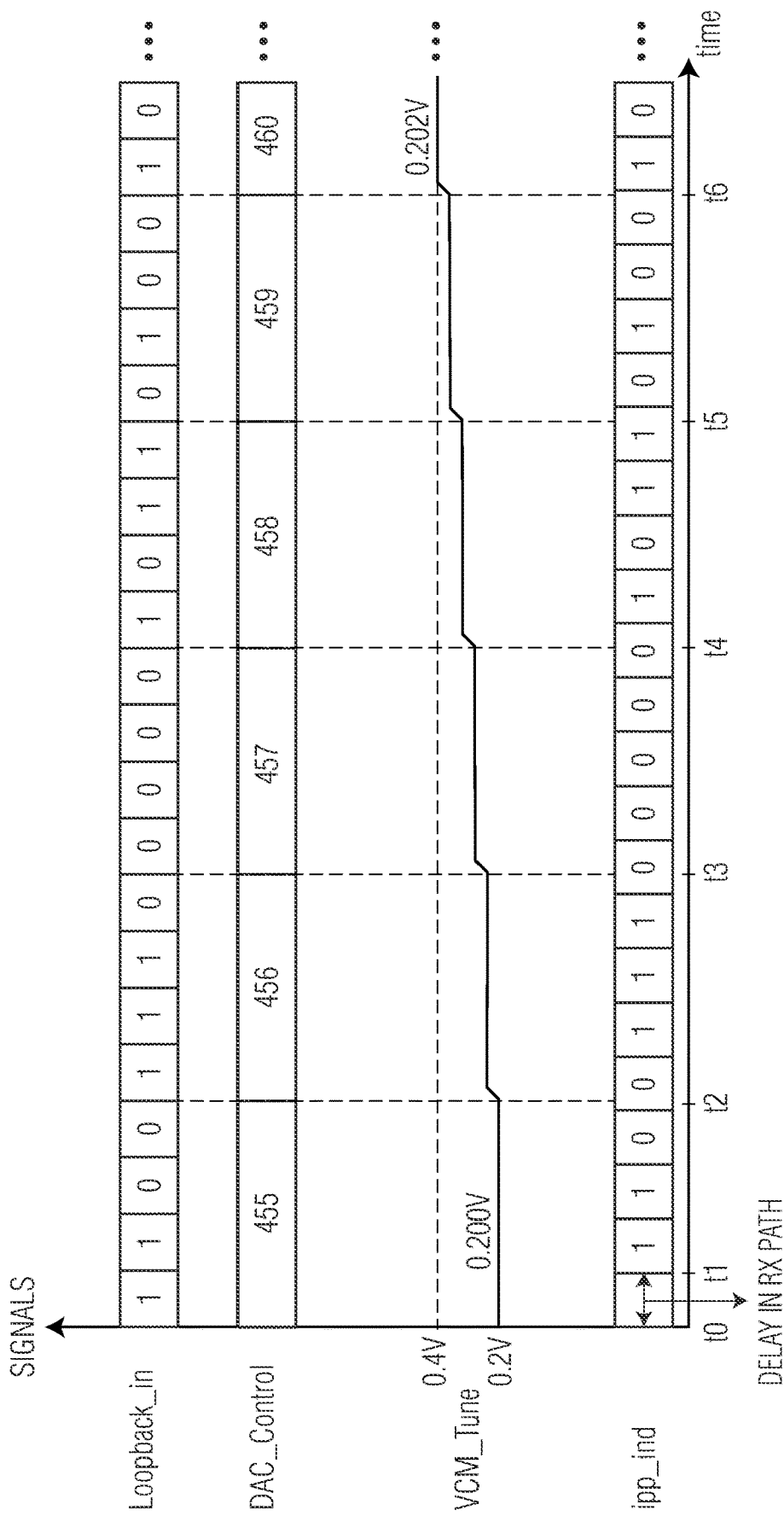
FIGS. 3 and 4 illustrate a timing diagrams of various signals in the circuit of FIG. 1, in accordance with embodiments of the present invention.

FIG. 3 illustrates a timing diagram with Loopback_in (i.e. input test sequence), DAC_Control (i.e. DAC word), VCM_Tune, and ipp_ind (i.e. response sequence or received sequence). The DAC_Control is provided as input to DAC 114 which results in the desired value of VCM_Tune. In one embodiment, DAC 114 is a 12-bit DAC, in which the value of DAC_Control is updated by digital controller 102 after every N test bits (e.g., such as after every 4 bits). In one embodiment, DAC 114 can provide each common mode voltage within the entire common mode voltage range, such as, for example, 0.2V-1.6V for a voltage supply (VDDA) of 1.8V. In this example, a DAC_Control value of 0 results in an output of 0V (VCM_Tune=0) and a maximum DAC value of 3641 results in an output of 1.6V. Also, in this example, each increment or decrement of the DAC_Control value results in the output voltage increasing or decreasing by a particular step size, e.g. 400 microvolts (uV), in this example. Therefore, in the illustrated embodiment of FIG. 3, the value of DAC_Control is incrementally increased by digital controller 102 from 455 to 460, resulting in VCM_Tune increasing from 0.200V to 0.202V, with 400 uV steps. Further, each DAC_Control value (i.e. each resulting value of VCM_Tune) is maintained for 4 bits of the input test sequence.

Referring to FIG. 3, the input test sequence is a stream of digital values (ones or zeros) which is randomly generated by digital controller 102. For example, digital controller 102 may include a Linear Feedback Shift Register (LFSR) to generate the random stream. With Loopback_en asserted, the input digital stream is provided via buffers 108 as Loopback_in to dummy TX 112. Dummy TX 112 converts Loopback_in to a differential test signal at Pad_N_test and Pad_P_test which is provided as a differential input to RX 110. RX 110 then converts the received differential test signal back to a stream of digital values provided as the response sequence, ipp_ind. The response sequence, ipp_ind, is provided via buffers 106 to digital controller 102. Note that the response sequence is received from the loopback circuit at a delay time after the input test sequence is provided to the loopback circuit, due to the delay in the loopback circuit path (e.g. delays in dummy TX 112 and RX 110). Digital controller 102 then compares the received response sequence with the sent input test sequence to determine if RX 110 is operating as expected. In one embodiment, to determine whether the response sequence matches the test sequence, digital controller 102 may use a multiple input shift register (MISR) to generate test signatures.

If the response sequence matches the input sequence, then RX 110 functioned properly over the tested range of common mode voltages for the test differential signal provided by dummy TX 112 to RX 110. For example, for the test in FIG. 3, if the sequences match, RX 110 is deemed to have functioned properly for a differential input signal having a common mode voltage in a range of 0.200V-0.202V. In the case that the DAC_Control value is updated every 4 bits, the entire common mode range (0.2V, corresponding to a DAC_Control value of 455, to 1.6V, corresponding to a DAC_Control value of 3641) can be tested using a test sequence of 12744 bits (corresponding to 4*(3641-455)). Note that value N of test bits for updating the DAC_Control value can be set to any integer value greater than zero, in which 4 bits is just an example. However, the value of N corresponds to the required test time to complete testing.

Figure 4:
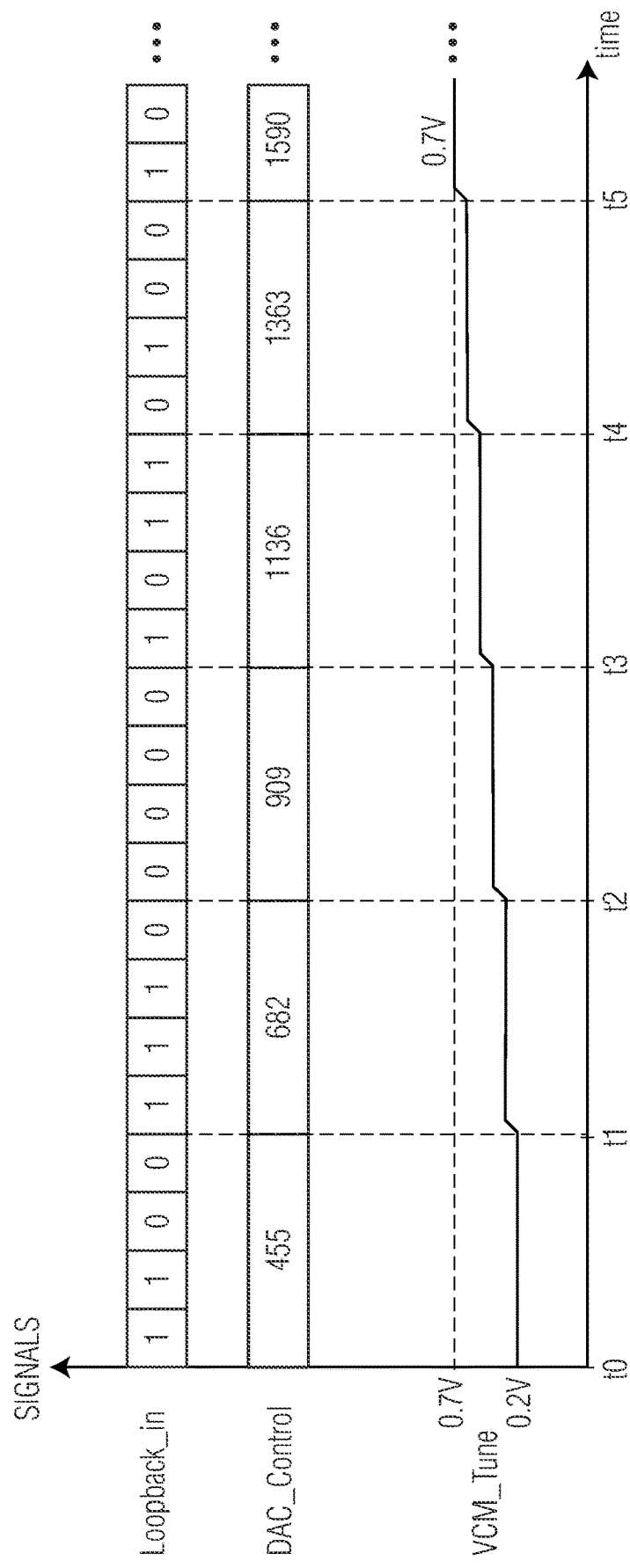

FIG. 4 illustrates a timing diagram with Loopback_in (i.e. input test sequence), DAC_Control (i.e. DAC word), and VCM_Tune in accordance with another example. In this example, common mode voltage shift can be checked with a pre-programmed shift by digital controller 102. For example, sensitivity to common mode voltage shift can be tested using various starting and stopping common mode voltages with different step sizes. In the illustrated example, the common mode voltage range of 0.2V to 0.7V is tested using a 100 mV step. As with the example of FIG. 3, DAC 114 may be a 12-bit DAC in which a DAC_Control value of 455 provides VCM_Tune at 0.2V, and the DAC_Control value can be incremented after each N test bits (4 again, in this example) by a step size of 227. In this manner, every 4 bits of the input test sequence, the DAC_Control value is incremented by 227 starting at 455 up to 1590, such that VCM_Tune increments from 0.2V to 0.7V in 100 mV steps.

Any combination of start/stop values and step sizes may be used by digital controller 102 for DAC_Control so as to produce the desired values of VCM_Tune. By being able to control or tune the value of VCM_Tune, the sensitivity of RX 110 to common mode shift can be tested. Note that test time can be reduced by covering the common mode voltage range during test more coarsely, such as by using a greater step size. On the other hand, finer tuned sensitivity testing can be achieved using smaller step sizes but at the cost of longer test times. The predetermined starting, ending, and step values for DAC_Control can be stored, for example, within digital controller 102 or elsewhere within the IC.

Figure 5:
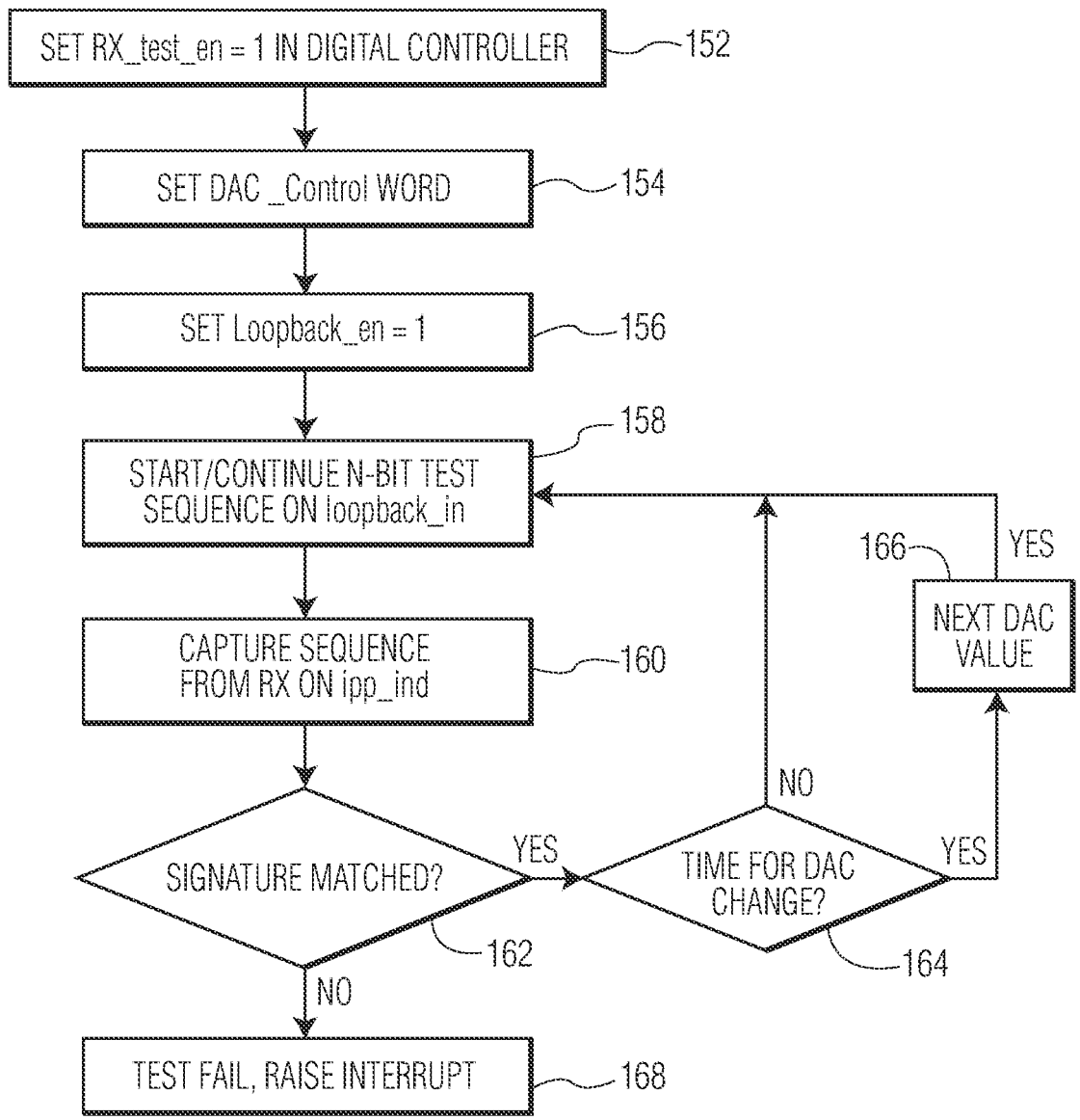
FIG. 5 illustrates, in flow diagram form, a method of testing the receiver circuit of FIG. 1 using the loopback circuit, in accordance with one embodiment of the present invention.

FIG. 5 illustrates, in flow diagram form, a method 150 for testing receiver circuit 100 using the loopback circuit, in accordance with one embodiment of the present invention. Method 150 begins with block 152 in which a receiver test enable signal, RX_test_en, provided to digital controller 102 is asserted (e.g. set to a logic level 1) to enable testing of the receiver circuit (e.g. receiver circuit 100). Next, the DAC_Control word is set to the appropriate initial value (e.g. 455, corresponding to 0.2V) and loopback_en is asserted (e.g. set to a logic level 1) in blocks 154 and 156, respectively. In block 158, the loopback testing begins by starting with the initial N-bits of the input test sequence (e.g. the first 4 bits of Loopback_in) in which digital controller 102 provides the next bit (first bit, in this case) of the initial N-bits. Next, in block 160, the response sequence is captured by digital controller 102. At decision diamond 162, it is determined whether the response sequence matches the input test sequence. In one embodiment, this is done by generating a signature based on the response sequence which is compared with an expected signature based on the input test sequence. If, at decision diamond 162, the signatures do not match, the test fails, and a pass/fail indicator may be provided (block 168) to indicate the failure. For example, an interrupt may be generated.

However, if at decision diamond 162, the signatures match, then digital controller 102 determines if a new DAC_Control value is needed. For example, if the current group of N test bits has not been completed (e.g. all 4 bits have not yet been processed), the DAC_Control value is not changed such that the voltage of VCM_Tune remains at its current voltage value. Returning to block 158, the loopback testing continues with a next bit of the current N-bit sequence of the input test sequence. If, at decision diamond 164 the current group of N test bits has been completed (e.g. all 4 bits have been processed), the digital controller 102 updates the value of DAC_Control in block 166 (e.g. increments the value by the appropriate step size, such as 455 to 456 as in FIG. 3 or 455 to 682 as in FIG. 4). With the updated of the DAC_Control value, the voltage of VCM_Tune also changes to the next common mode voltage to be tested (e.g. 0.200V to 0.202V in FIG. 3 or 0.2V to 0.7V in FIG. 4). Method 150 returns to block 158 in which loopback testing continues with the initial bit of the next N bits of the input test sequence (assuming all bits of the input test sequence have not already been processed). The loopback testing continues until the entire input test sequence is completed such that receiver circuit 100 is tested over the full desired range of common mode voltages, using the desired voltage stepsize to cover that desired range. Note that the processing of each bit of the input test sequence to provide a corresponding response bit can be referred to as a testing cycle.

In one embodiment, the testing of the receiver circuit using the loopback circuit is performed during manufacture, to determine faulty parts before shipping to customers. Alternatively or in addition, the testing may be done during operation of the IC. For example, during end use in the field as the IC ages, the receiver testing using the loopback circuit can be enabled, as needed, to help determine current health of the receiver circuit, such as by determining sensitivity to common mode drift at that subsequent point in time. Note also that method 150 may include additional operations or combine operations or perform operations in a different order or simultaneously as compared to the illustrated embodiment of FIG. 5.

Figure 6:
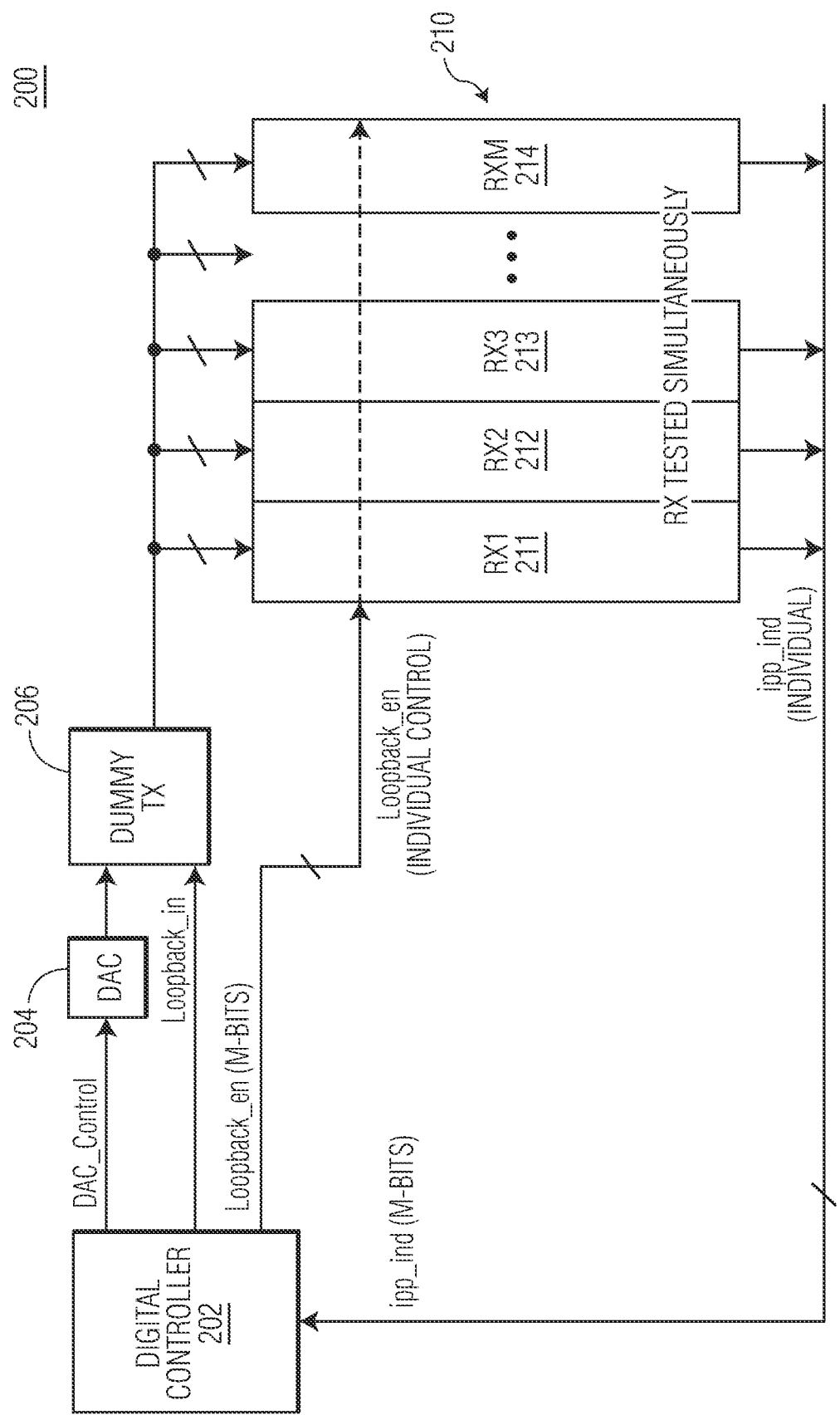
FIG. 6 illustrates, in block diagram form, an integrated circuit including a plurality of receiver circuits, such as the receiver circuit of FIG. 1, in accordance with one embodiment of the presents invention.

FIG. 6 illustrates receiver circuit 200 (which, as with receiver circuit 100, may be implemented on an IC or an SoC) which includes a set 210 of M receivers, RX1 211, RX2 212, RX3 213, to RXM 214, in which M is any integer greater than one. Each of the M receiver is analogous to RX 110 of FIG. 1. For example, each receiver may be an LVDS receiver which operates in a similar manner to RX 110. Receiver circuit 200 also includes a digital controller 202, a DAC 204, a dummy transmitter 206. Digital controller 202 is analogous to digital controller 102, except that it can handle multiple input test sequences (e.g. multiple LFSR sequences) and multiple response sequences. In this example, all M receivers (211-214) can be tested simultaneously, which reduces overall test time.

Receiver circuit 200 implements loopback testing of the receivers, similar to the loopback testing of receiver circuit 100. In this example, though, the M receivers 211-214 all share digital controller 202, DAC 204 (used to generate the tunable common mode voltage, VCM_Tune), and dummy TX 206. DAC 204 and dummy TX 206 are analogous to DAC 114 and dummy TX 112 of FIG. 1, and operate the same way. (Note that buffers such as buffers 106 and 108 may also be present in FIG. 6, but have been left out so as not to further complicate the drawing.) Therefore, in operation, when RX testing is enabled, digital controller 202 may send an input test sequence as Loopback_in to dummy TX 206 and may also send a unique Loopback_en signal to each of the receivers. Therefore, the Loopback_en is M-bits in this example, in which one bit (for one Loopback_en signal) is provided to each of receivers 211-214.

Each of receivers 211-214 receives the differential output from dummy TX 206 as a test differential input (rather than receiving a differential input from corresponding external pads as would happen during normal operation). Upon assertion of the corresponding Loopback_en signal to enable the loopback testing, the receivers operate to convert the test differential input signals into a test response sequence, which is individually provided from each receiver as a digital data stream, ipp_ind. Therefore, the ipp_ind that is returned to digital controller 202 for each testing cycle is M-bits of ipp_ind, one bit from each receiver. As with digital controller 102, digital controller 202 determines whether the signatures of the response sequences from each receiver matches the signature of the input test sequence provided to dummy TX 206.

Note that the flow diagram of FIG. 5 can also be used for receiver circuit 200. The difference would be that digital controller 202 could send a Loopback_en to each receiver (e.g. in block 156), and each receiver would generate its corresponding response sequence which would be captured as the corresponding ipp_ind by digital controller 202 (e.g. in block 160). In block 162, digital controller 202 would check each the signature of each received response sequence against the expected signature and could provide a corresponding pass/fail indicator for each receiver.

Figure 7:
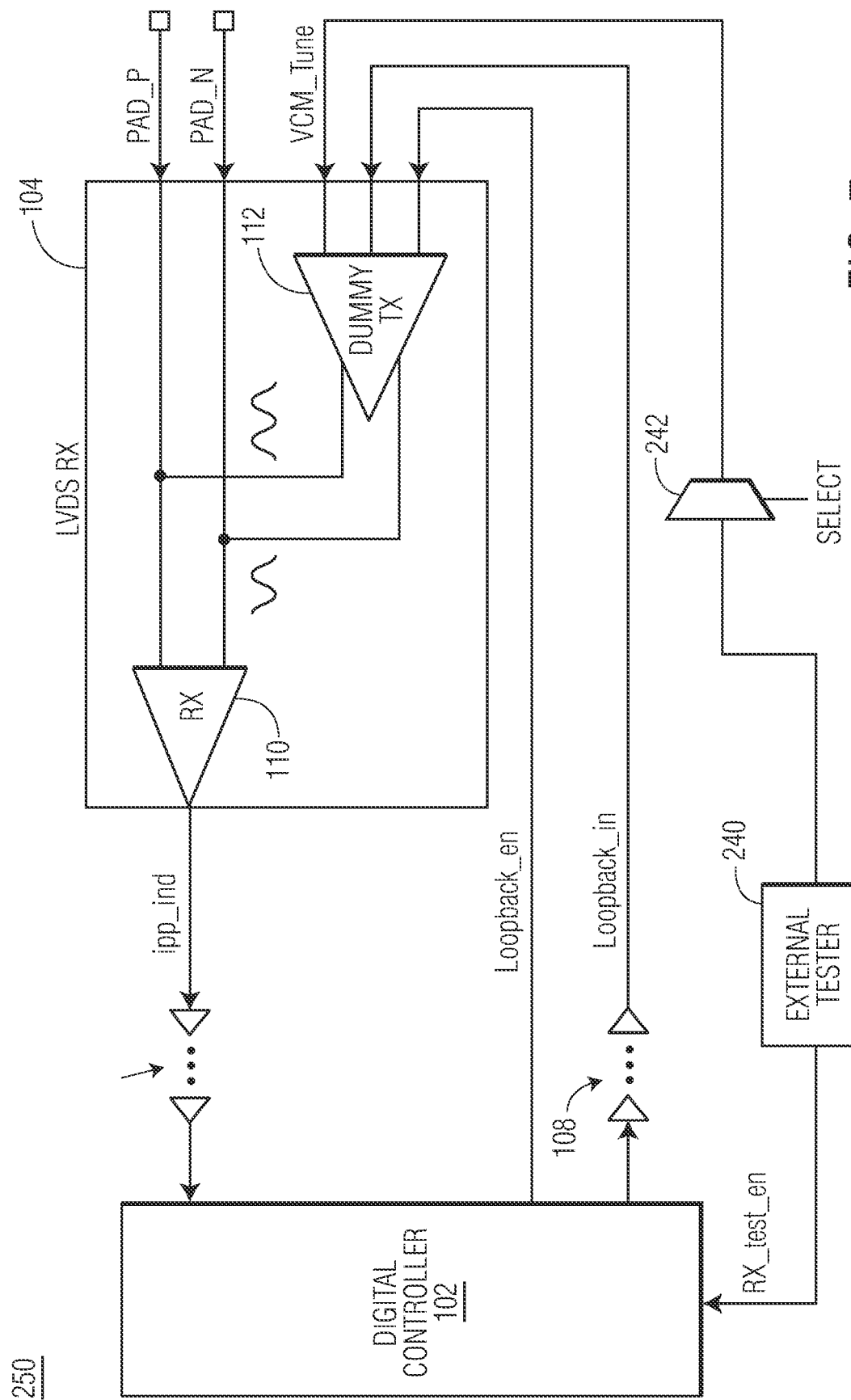
FIG. 7 illustrates, in partial block diagram and partial schematic form, a differential input receiver circuit with a loopback circuit in accordance with one embodiment of the present invention.

FIG. 7 illustrates, in partial block diagram form and partial schematic form, a receiver 250 which illustrates an alternate embodiment of receiver circuit 100 of FIG. 1, in which like numerals indicate like references. FIG. 7 also includes an external tester 240 which is external to the IC containing receiver circuit 250. In receiver circuit 250, rather than using DAC 114 to generate VCM_Tune based on a DAC control word (DAC_Control) from digital controller 102, external tester 240 can be used instead. For example, receiver circuit 250 may include a multiplexer (MUX) 242 which may receive any number of test inputs, including an input from external tester 240 (e.g. a force/test bus (such as an analog voltage bus) from external tester 240). During the BIST testing of receiver circuit 250 with external tester 240, external tester 240 can provide RX_test_en to digital controller 102 to enable the testing of the receiver circuit. Digital controller 102 can then provide Loopback_en and Loopback_in to the loopback circuit and receive ipp_ind from the loopback circuit, as described above. However, instead of providing a control word to a DAC to generate VCM_Tune, external tester 240 can provide the tunable common mode voltage via MUX 242 (in which the input from external tester 240 is selected by the Select signal to MUX 242) to dummy TX 112 as VCM_Tune. In this example, note that digital controller 102 can send a pass/fail indicator back to external tester 240.

Therefore, by now it can be understood how a loopback circuit may be used to test a receiver circuit over a wide range of common mode voltages in order to obtain more complete testing of the receiver circuit and to determine sensitivity of the receiver circuit to common mode voltage shift. In one embodiment, a dummy transmitter is used to generate a test differential signal using a received tunable common mode voltage which can be tuned to a variety of different common mode voltages, as needed to test the desired range of common mode voltages. In one embodiment, the tunable common mode voltage is generated by provided a DAC control word to a DAC, in which the DAC output provides the common mode voltage to the dummy TX. Alternatively, the tunable common mode voltage can be provided by an external tester. By setting the common mode voltage to different values, using, for example, a predetermined start value, predetermined end value, and predetermined step value, the test time, as well as the coverage of the receiver circuit, can be varied as desired.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of transmitter 100, transmitter 200, or IC 300 are each circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the current measurement resistors of FIGS. 1 and 2 can be referred to as current measurement resistor circuits and may be implemented with multiple resistors or with different configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit device includes a low voltage differential signaling (LVDS) receiver that includes a receiver circuit including a first input coupled to a first conductive pad, a second input coupled to a second conductive pad, and an output coupled to an input of a digital controller; and a dummy transmitter circuit including a first input coupled to receive a common mode voltage (VCM) tune signal, a second input coupled to a loopback input signal, a third input coupled to a loopback enable signal, a first output coupled to the first input of the receiver circuit, and a second output coupled to the second input of the receiver circuit. When a test mode of operation is enabled, the digital controller asserts the loopback enable signal, and the dummy transmitter circuit generates a pair of test differential signals based on the loopback input signal and the VCM tune signal, wherein the VCM tune signal varies to test the LVDS receiver over a range of common mode voltages. In one aspect, when the test mode of operation is enabled, each of the pair of test differential signals are provided at respective one of the first and second inputs to receiver circuit rather than a pair of differential signals from the first and second conductive pads. In another aspect, the integrated circuit device further includes one or more buffers coupled in series between the output of the receiver circuit and the input to the digital controller. In another aspect, the integrated circuit device further includes one or more buffers coupled in series between the second input to the dummy transmitter circuit and an output of the digital controller that provides the loopback input signal. In another aspect, the integrated circuit device further includes a digital to analog converter (DAC) coupled between an output of the digital controller that provides a DAC control signal, and the third input to the dummy transmitter circuit coupled to the VCM tune signal, wherein an output of the DAC is the VCM tune signal. In yet another aspect of the above embodiment, the pair of test differential signals includes a first pad test signal of a first polarity and a second pad test signal of a second polarity. In a further aspect, the dummy transmitter includes an error correction amplifier including a first input coupled to a common mode voltage, a second input coupled to the VCM tune signal, and an output that provides a bias voltage. In yet a further aspect, the dummy transmitter further includes a pull-down device including a control electrode coupled to the bias voltage, a first current electrode coupled to a first current electrode of a pull-down device in a first branch and a first current electrode of a pull-down device in a second branch of the dummy transmitter circuit, and a second current electrode coupled to a first supply voltage; and a pull-up device including a control electrode coupled to a second bias voltage, a first current electrode coupled to a second supply voltage, and a second current electrode coupled to a first current electrode of a pull-up device in the first branch and a first current electrode of a pull-up device in the second branch of the dummy transmitter circuit. In yet an even further aspect, the pull-down device in the first branch further includes a control electrode coupled to the loopback input signal and a second electrode coupled to a second electrode of the pull-up device in the first branch, and the pull-up device in the first branch includes a control electrode coupled to the loopback input signal; and the pull-down device in the second branch further includes a control electrode coupled to a complement of the loopback input signal and a second electrode coupled to a second electrode of the pull-up device in the second branch, and the pull-up device in the second branch includes a control electrode coupled to the complement of the loopback input signal. In yet an even further aspect, the dummy transmitter further includes a first resistor including a first terminal coupled between the second electrodes of the pull-down and pull-up devices in the first branch, and a second terminal coupled between the second electrodes of the pull-down and pull-up devices in the second branch; and second and third resistors coupled in series, the second resistor including a first terminal coupled between the second electrodes of the pull-down and pull-up devices in the first branch, and the third resistor including a first terminal coupled between the second electrodes of the pull-down and pull-up devices in the second branch. In an even further aspect, the first pad test signal is provided at the first terminal of the first resistor and the second pad test signal is provided at the second terminal of the first resistor. In another aspect, the DAC control signal increases incrementally over time from a low value of the common mode range to an upper value of the common mode range. In yet another aspect, the output of the dummy transmitter is coupled to provide the pair of test differential signals to test multiple receiver circuits over the range of common mode voltages.

In another embodiment, an integrated circuit device includes a digital controller configured to provide a digital test sequence and receive a digital response sequence in response to the digital test sequence; a dummy transmitter configured to convert the digital test sequence to test differential signals, wherein the test differential signals are based on a tunable common mode voltage that varies incrementally over time over a range of common mode voltages; and a receiver circuit configured to convert the test differential signals from the dummy transmitter into the digital response sequence, wherein the range of common mode voltages includes a range of common mode voltages potentially used in the receiver circuit. In one aspect, the receiver circuit is coupled to external conductive pads and configured to receive differential pad signals during a non-test mode of operation and configured to receive the test differential signals from the dummy transmitter during a test mode of operation.

In yet another embodiment, a method of testing a low voltage differential signaling (LVDS) receiver having a receiver circuit and a transmitter circuit includes, during a test mode of operation, generating test differential signals, by the transmitter circuit, from an input digital test sequence based on a tunable common mode voltage that varies incrementally over time over a range of common mode voltage values potentially used in a receiver circuit; providing the test differential signals to the receiver circuit; generating, by the receiver circuit, a digital response sequence in response to the test differential signals to determine whether the digital response sequence matches the digital test sequence; and when the digital response sequence from the receiver matches the digital test sequence, generating the test differential signals, by the transmitter circuit, using a next common mode voltage value for the tunable common mode voltage. In one aspect, the receiver circuit is coupled to external conductive pads to receive differential pad signals during a non-test mode of operation, and to receive the test differential signals from the transmitter during the test mode of operation. In another aspect, the method further includes testing multiple receivers over the range of common mode voltages with the test differential signals. In another aspect, the method further includes receiving, by a digital to analog converter (DAC), a digital control word; and generating, by the DAC, the tunable common mode voltage in response to the digital control word. In yet another aspect, the method further includes generating the tunable common mode voltage using test equipment that is external to an integrated circuit that includes the LVDS receiver.

A low voltage differential signaling (LVDS) receiver includes a receiver circuit including first and second inputs coupled to first and second conductive pads, respectively, and an output coupled to an input of a digital controller, and a dummy transmitter circuit including a first input coupled to receive a common mode voltage (VCM) tune signal, a second input coupled to a loopback input signal, a third input coupled to a loopback enable signal, a first output coupled to the first input of the receiver circuit, and a second output coupled to the second input of the receiver circuit. When a test mode of operation is enabled, the digital controller asserts the loopback enable signal, and the dummy transmitter circuit generates a pair of test differential signals based on the VCM tune signal, wherein the VCM tune signal varies to test the LVDS receiver over a range of common mode voltages.

The invention claimed is:

1. An integrated circuit device comprising:
 a low voltage differential signaling (LVDS) receiver that includes:
  a receiver circuit including a first input coupled to a first conductive pad, a second input coupled to a second conductive pad, and an output coupled to an input of a digital controller;
  a dummy transmitter circuit including a first input coupled to receive a common mode voltage (VCM) tune signal, a second input coupled to a loopback input signal, a third input coupled to a loopback enable signal, a first output coupled to the first input of the receiver circuit, and a second output coupled to the second input of the receiver circuit; and
  when a test mode of operation is enabled, the digital controller asserts the loopback enable signal, and the dummy transmitter circuit generates a pair of test differential signals based on the loopback input signal and the VCM tune signal, wherein the VCM tune signal varies to test the LVDS receiver over a range of common mode voltages.

2. The integrated circuit device of claim 1, wherein when the test mode of operation is enabled:
 each of the pair of test differential signals are provided at respective one of the first and second inputs to receiver circuit rather than a pair of differential signals from the first and second conductive pads.

3. The integrated circuit device of claim 1, further comprising:
 one or more buffers coupled in series between the output of the receiver circuit and the input to the digital controller.

4. The integrated circuit device of claim 1, further comprising:
one or more buffers coupled in series between the second input to the dummy transmitter circuit and an output of the digital controller that provides the loopback input signal.

5. The integrated circuit device of claim 1, further comprising:
a digital to analog converter (DAC) coupled between an output of the digital controller that provides a DAC control signal, and the third input to the dummy transmitter circuit coupled to the VCM tune signal, wherein an output of the DAC is the VCM tune signal.

6. The integrated circuit device of claim 1, wherein:
the pair of test differential signals includes a first pad test signal of a first polarity and a second pad test signal of a second polarity.

7. The integrated circuit device of claim 6, wherein the dummy transmitter includes:
an error correction amplifier including a first input coupled to a common mode voltage, a second input coupled to the VCM tune signal, and an output that provides a bias voltage.

8. The integrated circuit device of claim 7, wherein the dummy transmitter further includes:
a pull-down device including a control electrode coupled to the bias voltage, a first current electrode coupled to a first current electrode of a pull-down device in a first branch and a first current electrode of a pull-down device in a second branch of the dummy transmitter circuit, and a second current electrode coupled to a first supply voltage; and
a pull-up device including a control electrode coupled to a second bias voltage, a first current electrode coupled to a second supply voltage, and a second current electrode coupled to a first current electrode of a pull-up device in the first branch and a first current electrode of a pull-up device in the second branch of the dummy transmitter circuit.

9. The integrated circuit device of claim 8 wherein:
the pull-down device in the first branch further includes a control electrode coupled to the loopback input signal and a second electrode coupled to a second electrode of the pull-up device in the first branch, and the pull-up device in the first branch includes a control electrode coupled to the loopback input signal;
the pull-down device in the second branch further includes a control electrode coupled to a complement of the loopback input signal and a second electrode coupled to a second electrode of the pull-up device in the second branch, and the pull-up device in the second branch includes a control electrode coupled to the complement of the loopback input signal.

10. The integrated circuit device of claim 9 wherein the dummy transmitter further includes:
a first resistor including a first terminal coupled between the second electrodes of the pull-down and pull-up devices in the first branch, and a second terminal coupled between the second electrodes of the pull-down and pull-up devices in the second branch; and
second and third resistors coupled in series, the second resistor including a first terminal coupled between the second electrodes of the pull-down and pull-up devices in the first branch, and the third resistor including a first terminal coupled between the second electrodes of the pull-down and pull-up devices in the second branch.

11. The integrated circuit device of claim 10 wherein:
the first pad test signal is provided at the first terminal of the first resistor and the second pad test signal is provided at the second terminal of the first resistor.

12. The integrated circuit device of claim 5 wherein:
the DAC control signal increases incrementally over time from a low value of the common mode range to an upper value of the common mode range.

13. The integrated circuit device of claim 1 wherein:
the output of the dummy transmitter is coupled to provide the pair of test differential signals to test multiple receiver circuits over the range of common mode voltages.

14. An integrated circuit device comprising:
a digital controller configured to provide a digital test sequence and receive a digital response sequence in response to the digital test sequence;
a dummy transmitter configured to convert the digital test sequence to test differential signals, wherein the test differential signals are based on a tunable common mode voltage that varies incrementally over time over a range of common mode voltages; and
a receiver circuit configured to convert the test differential signals from the dummy transmitter into the digital response sequence, wherein the range of common mode voltages includes a range of common mode voltages potentially used in the receiver circuit.

15. The device of claim 14 wherein:
the receiver circuit is coupled to external conductive pads and configured to receive differential pad signals during a non-test mode of operation and configured to receive the test differential signals from the dummy transmitter during a test mode of operation.

16. A method of testing a low voltage differential signaling (LVDS) receiver having a receiver circuit and a transmitter circuit, comprising:
during a test mode of operation:
generating test differential signals, by the transmitter circuit, from an input digital test sequence based on a tunable common mode voltage that varies incrementally over time over a range of common mode voltage values potentially used in a receiver circuit;
providing the test differential signals to the receiver circuit;
generating, by the receiver circuit, a digital response sequence in response to the test differential signals to determine whether the digital response sequence matches the digital test sequence; and
when the digital response sequence from the receiver matches the digital test sequence, generating the test differential signals, by the transmitter circuit, using a next common mode voltage value for the tunable common mode voltage.

17. The device of claim 16 wherein:
the receiver circuit is coupled to external conductive pads to receive differential pad signals during a non-test mode of operation, and to receive the test differential signals from the transmitter during the test mode of operation.

18. The method of claim 16 further comprising:
testing multiple receivers over the range of common mode voltages with the test differential signals.

19. The method of claim 16 further comprising:
receiving, by a digital to analog converter (DAC), a digital control word; and
generating, by the DAC, the tunable common mode voltage in response to the digital control word.

20. The method of claim 16 further comprising:
generating the tunable common mode voltage using test equipment that is external to an integrated circuit that includes the LVDS receiver.

* * * * *